United States Patent [19]

Martinelli et al.

[11] 3,845,496

[45] Oct. 29, 1974

[54] INFRARED PHOTOCATHODE

[75] Inventors: Ramon Ubaldo Martinelli, Hightstown; Bernard Goldstein, Princeton, both of N.J.

[73] Assignee: RCA Corporation, New York, N.Y.

[22] Filed: Sept. 10, 1973

[21] Appl. No.: 395,733

[52] U.S. Cl. .................................... 357/30, 357/52

[51] Int. Cl. .......................................... H01d 15/00

[58] Field of Search ..... 317/235 N, 235 R, 235 AT, 317/235 AG

[56] References Cited

UNITED STATES PATENTS

| | | | |
|---|---|---|---|
| 3,387,161 | 6/1968 | VanLaar | 313/94 |
| 3,478,213 | 11/1969 | Simon | 250/207 |
| 3,666,548 | 5/1972 | Brack | 117/212 |
| 3,672,992 | 6/1972 | Schaefer | 117/219 |
| 3,699,404 | 10/1972 | Simon | 317/235 R |

OTHER PUBLICATIONS

J. Scheer, Philips Res. Reports, 15, 584 (1960).

Scheer et al., Solid State Communications, 3, 189–193, 1965.

*Primary Examiner*—Martin H. Edlow

*Attorney, Agent, or Firm*—Glenn H. Bruestle; Robert J. Boivin

[57] ABSTRACT

The photocathode described has improved quantum efficiency in the near infrared wavelength region. The photocathode comprises a silicon crystal having carbon atoms bound to the silicon in the surface region and a work-function-reducing layer.

10 Claims, 3 Drawing Figures

INFRARED PHOTOCATHODE

The invention disclosed herein was made in the course of, or under, a contract or subcontract thereunder with the Department of the Army.

BACKGROUND OF THE INVENTION

The present invention relates to the generation of charge carriers within the surface region of a semiconductor device and is particularly applicable to semiconductor photocathodes which are activated with a work-function-reducing layer such as cesium and oxygen.

The various functions performed by semiconductor devices generally involve the generation of charge carriers in a specified region in the devices in response to some input energy. The generated charge carriers may then be influenced in various ways to perform modulation, amplification, etc. For some applications of semiconductors, the input energy is strictly limited. This is true, for example, for photoemissive devices, where the input energy is determined by the energy of the light available for excitation of charge carriers.

At present, the best known, generally available photocathode for sensing near infrared light on the order of 1.2 microns wavelength is commonly known as the S–1 photocathode, which is a combination of silver-oxygencesium. However, even the S–1 photocathode has a very low quantum efficiency at wavelengths of 1.1$\mu$m and longer.

SUMMARY OF THE INVENTION

A semiconductor device for sensing radiation is presented which comprises a silicon substrate, a surface region having a work-function-reducing layer on the (100) surface of said substrate, and a surface impurity concentration of at least $10^{12}$ carbon atoms/cm$^2$ within said surface region.

DETAILED DESCRIPTION

Figure 1:
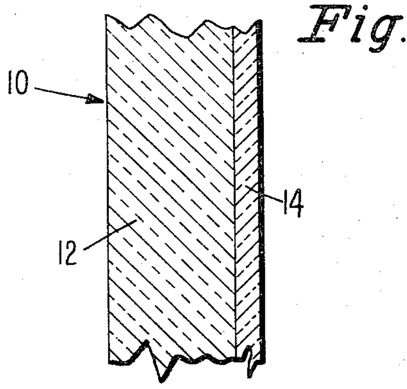
FIG. 1 shows a cross section of a fragment of a photoemissive cathode in accordance with a preferred embodiment of the novel device.

Referring generally to FIG. 1, the preferred embodiment of the photocathode 10 is shown. The photocathode 10 comprises a bulk substrate 12 of a semiconductor such as silicon which is used in the preferred embodiment. The substrate 12 has a thickness of about 250$\mu$m. A surface region 14 is formed on one surface of the substrate 12. The surface region 14 includes a work-function-reducing layer which may consist of cesium and oxygen for a silicon substrate 12. Such work-function-reducing layers are generally described in U.S. Pat. No. 3,632,442 to Turnbull, issued Jan. 4, 1972. As will be recognized by one skilled in the art, materials other than cesium and oxygen, such as rubidium and oxygen, can be utilized in forming a work-function-reducing layer. The surface region 14 also includes a surface impurity such as carbon, which is present in the preferred embodiment in a concentration of at least $10^{12}$ atoms/cm$^2$. The surface region 14 has a thickness of approximately 3 A.

In order to make the photocathode 10 of the preferred embodiment, one starts with the surface in the (100) Miller Index Plane of a silicon crystal substrate 12 and cleans it, as by argon ion sputtering in a vacuum at 600 eV ion bombarding energy and 10 $\mu$amps/cm$^2$ current density for about 30 minutes. To form the surface region 14, the cleaned surface is then exposed to a carbonaceous gas such as ethane, $C_2H_6$, at a vacuum of about $10^{-5}$ torr for 15 hours. Then, the substrate 12 with the carbonaceous surface is annealed at about 850°C for about 2 minutes. The work-function-reducing layer is then added to the carbonaceous surface to form the surface region 14 by exposing the surface region 14 to cesium vapor in excess of the amount for maximum photoemission. Thereafter, the region 14 is exposed to oxygen until peak photoemission is reached.

Figure 2:
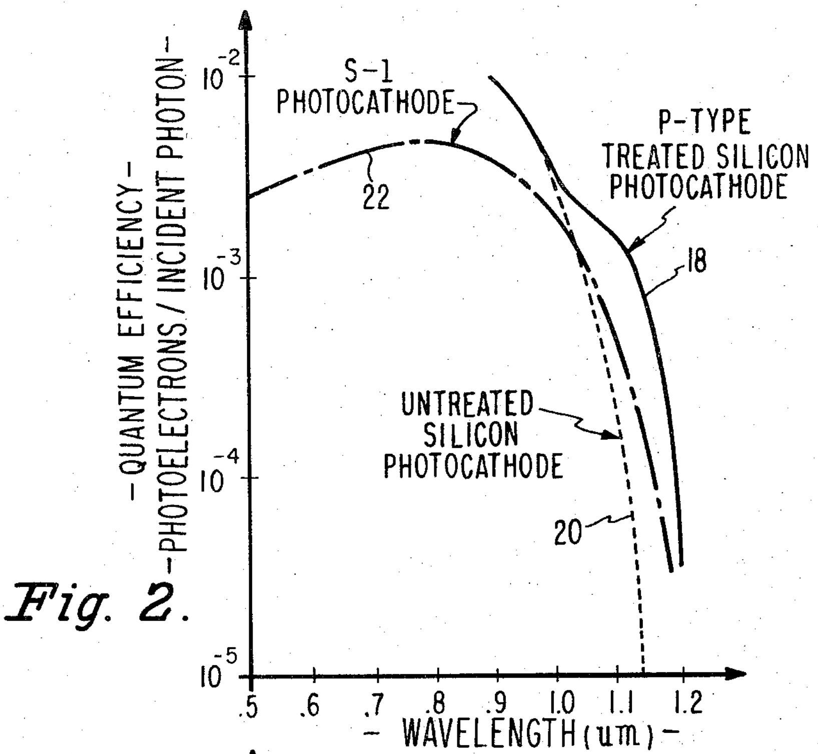
FIG. 2 is a graph representing the quantum efficiency, as related to the photon wavelength of one embodiment of the present invention, compared to that of a prior art device.

The increased quantum efficiency of the photocathode 10 is significantly greater in the near-infrared region than that of the previously available S–1 photocathode. This effect is a surface effect which is independent, in the near-infrared region, of the doping of the silicon substrate 12. Referring generally to FIG. 2, there is shown a comparison of an S–1 photocathode to a p-type silicon photocathode 10 of the present invention, and to an untreated silicon cathode. The p-type silicon photocathode of FIG. 2 was doped with $10^{17}$ boron atoms/cm$^3$. By untreated it is meant that the silicon photocathode was not treated with carbon but does have a work-function-reducing layer. The solid line 18 represents the performance of the photocathode 10 while the dashed line 20 represents that of the untreated silicon photocathode, and the broken solid line 22 represents an S–1 photocathode. It is seen in FIG. 2 that the line 18 indicates an extended red response beyond about 1.0$\mu$m wavelength, which can be 10 to 100 times greater than either the untreated photocathode or the S–1 photocathode.

Figure 3:
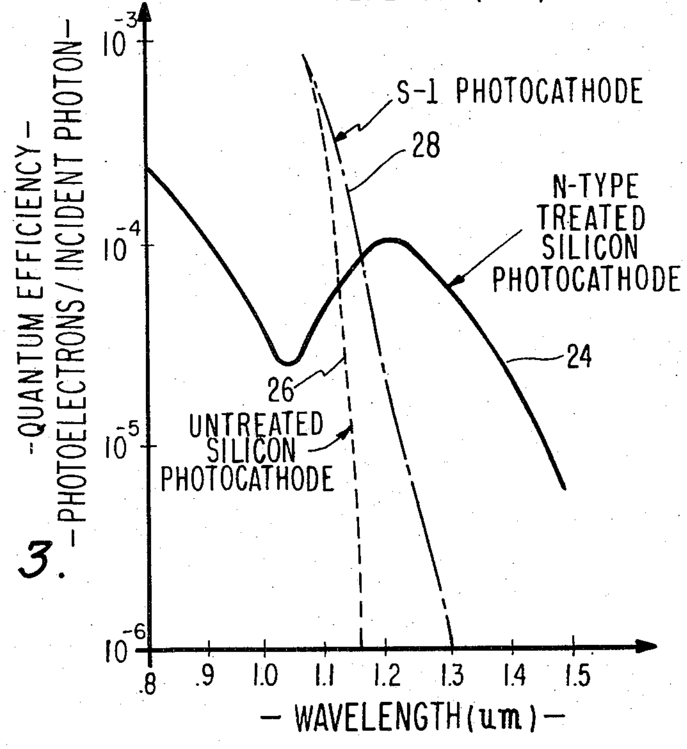
FIG. 3 is a graph representing the quantum efficiency, as related to the photon wavelength of another embodiment of the present invention, compared to that of a prior art device.

Referring generally to FIG. 3, a similar comparison is shown of an n-type silicon photocathode 10 doped with $5 \times 10^{14}$ arsenic atoms/cm$^3$, solid line 24; to an untreated p-type silicon cathode, dashed line 26; and an S–1 photocathode, broken solid line 28. Again, it is seen that the treated n-type silicon photocathode 10 has an extended red response with respect to either the S–1 photocathode or the untreated p-type silicon cathode.

As indicated by the comparative performance curves in FIGS. 2 and 3 of the preferred embodiments relative to prior art cathodes, the cathode 10 of the preferred embodiment has greatly increased quantum efficiency in the wavelength range of from about 1.1$\mu$m to about 1.6$\mu$m. This is a particularly useful wavelength range, since within this range there exists what is commonly referred to as an "atmospheric window." The "atmospheric window" is the absence of significant absorption bands within that range under normal atmospheric conditions. Absorption bands of water are located, however, near the ends of the range at 1.1$\mu$m and at 1.4$\mu$m. Thus, the wavelength range in question is particularly useful for sensing and communications through the atmosphere.

The quantum efficiency of the photocathode 10 described in the preferred embodiments is substantially improved in the near-infrared over that of the commonly-known S–1 photocathode, by a factor of 100 or more. While the nature of the phenomenon responsible for such improved performance is not presently completely understood, it is thought that carbon in the surface region 14 of the silicon crystal generates electrons in response to the longer wavelengths of 1.1 to about 1.6$\mu$m. Investigations to date indicate that the phenomenon responsible for this electron generation is in a surface region having a thickness of only about 3 A. For example, the extended response in the quantum efficiency curve is present in n-type silicon activated with cesium and oxygen as well as in p-type silicon activated with cesium and oxygen, despite the fact that n-type silicon activated with cesium and oxygen is known to have a negligible bulk photoemission. Also, the optical absorption constant of Si samples exhibiting the extended infrared photoresponse is characteristic of bulk absorption only, and it does not exhibit a corresponding extended infrared absorption.

The presence and the critical nature of the surface impurities which in the case of the preferred embodiment is carbon in the surface region, is indicated by the absence of the extended infrared quantum efficiency when the same crystal of silicon is heated to about 850°C for about 1 hour to drive the surface impurities out of the surface region and into the bulk. Thereafter, if the crystal is heated to about 1050°C for about 10 minutes, the impurities are known to return from the bulk to the surface, in the case of carbon and silicon, and accordingly, the extended infrared quantum efficiency is again present following activation of the sample with cesium and oxygen.

We claim:

1. The semiconductor device for sensing radiation comprising:

a. a silicon substrate, b. a surface region having a work-function-reducing layer on the (100) surface of said substrate, and c. a surface impurity concentration of at least $10^{12}$ carbon atoms/cm$^2$ within said surface region.

2. The device of claim 1 wherein said work-function-reducing layer comprises cesium and oxygen.

3. The device of claim 1 wherein said work-function-reducing layer comprises rubidium and oxygen.

4. The method of making a radiation sensing device comprising the steps of:

a. cleaning the (100) plane of a silicon crystal substrate;

b. exposing said cleaned (100) surface to a carbonaceous gas in a vacuum;

c. annealing said substrate; then d. coating said (100) surface with a work-function-reducing layer.

5. The method of claim 4 wherein said cleaning is accomplished by argon ion sputtering in a vaccum.

6. The method of claim 5 wherein said argon ion sputtering is accomplished at 600 eV ion bombarbing energy and 10$\mu$amps/cm$^2$ current density.

7. The method of claim 4 wherein said carbonaceous gas consists of ethane.

8. The method of claim 7 wherein said exposing step is accomplished over about 15 hours.

9. The method of claim 4 wherein said annealing step is accomplished at about 850°C for about 2 minutes.

10. The method of claim 4 wherein said work-function-reducing layer comprises a member of the group consisting of cesium and oxygen, and rubidium and oxygen.

* * * * *